(12) United States Patent
Jeong

(10) Patent No.: US 12,261,130 B2
(45) Date of Patent: Mar. 25, 2025

(54) SEMICONDUCTOR DEVICE

(71) Applicant: SK hynix Inc., Icheon-si (KR)

(72) Inventor: Yeo Jin Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 248 days.

(21) Appl. No.: 17/701,253

(22) Filed: Mar. 22, 2022

(65) Prior Publication Data

US 2023/0245983 A1    Aug. 3, 2023

(30) Foreign Application Priority Data

Feb. 3, 2022 (KR) .................. 10-2022-0013898

(51) Int. Cl.
*H01L 23/52* (2006.01)
*H01L 23/00* (2006.01)
*H01L 23/522* (2006.01)
*H01L 23/528* (2006.01)
*H01L 23/535* (2006.01)

(52) U.S. Cl.
CPC ........ *H01L 23/562* (2013.01); *H01L 23/5226* (2013.01); *H01L 23/5283* (2013.01); *H01L 23/535* (2013.01)

(58) Field of Classification Search
CPC .............. H01L 23/5226; H01L 23/528; H01L 23/5283; H01L 23/53214; H01L 23/53238
See application file for complete search history.

(56) References Cited

U.S. PATENT DOCUMENTS 7,091,087 B2 * 8/2006 Hurley .................. H10B 41/30
                                                           438/653
2018/0122743 A1 * 5/2018 Lai ...................... H01L 29/1608

FOREIGN PATENT DOCUMENTS

KR    101062820 B1    9/2011
KR    101412292 B1    6/2014

OTHER PUBLICATIONS

Korean Patent No. 1020090079749 (Year: 2009) [machine's translation].*

* cited by examiner

*Primary Examiner* — Tony Tran
(74) *Attorney, Agent, or Firm* — WILLIAM PARK & ASSOCIATES LTD.

(57) ABSTRACT

A semiconductor device may include first wiring lines, a plurality of second wiring lines located over the first wiring lines, an interlayer insulating layer comprising a first portion, the first portion located in a gap between second wiring lines that neighbor each other in the first direction and a first auxiliary wiring line electrically coupling the first wiring lines.

19 Claims, 10 Drawing Sheets

SEMICONDUCTOR DEVICE

CROSS-REFERENCE TO RELATED APPLICATION

This application claims priority under 35 U.S.C. § 119 to Korean Patent Application No. 10-2022-0013898 filed on Feb. 3, 2022, which is incorporated herein by reference in its entirety.

BACKGROUND

1. Technical Field

Generally, various embodiments relate to an electronic device, and more particularly, to a semiconductor device.

2. Related Art

A semiconductor device includes interconnections such as wiring lines and contact plugs for electrical connection between elements. Recently, in order to improve the operation speed and reliability of the semiconductor device, the materials, structures and fabrication methods of the interconnections have been developed.

SUMMARY

In an embodiment, a semiconductor device may include a first wiring lines spaced apart from each other in a first direction, second wiring lines located over the first wiring lines, an interlayer insulating layer comprising a first portion, the first portion located in a gap between second wiring lines that neighbor each other in the first direction, and a first auxiliary wiring line electrically coupling the first wiring lines. The first auxiliary wiring line may overlap the first portion of the interlayer insulating layer in a stacking direction, and the first wiring lines might not overlap the first portion of the interlayer insulating layer in the stacking direction.

In an embodiment, a semiconductor device may include a first interlayer insulating layer, first wiring lines located in the first interlayer insulating layer, a second interlayer insulating layer located over the first interlayer insulating layer, second wiring lines located in the second interlayer insulating layer, and an auxiliary wiring line located under the first interlayer insulating layer, and electrically coupling the first wiring lines. The first interlayer insulating layer may include a stress shielding region which overlaps the second wiring lines and a stress exposure region which does not overlap the second wiring lines, and the first wiring lines may be located in the stress shielding region.

DETAILED DESCRIPTION

Hereafter, embodiments in accordance with the technical spirit of the present disclosure will be described with reference to the accompanying drawings.

Various embodiments are directed to a semiconductor device having a stable structure and improved characteristics.

In accordance with an embodiment, it is possible to provide a semiconductor device having a stable structure and improved characteristics.

It will be understood that although the terms first, second, third etc. may be used herein to describe various elements, these elements should not be limited by these terms. These terms are only used to distinguish one element from another element, but not used to define only the element itself or to mean a particular sequence.

Figure 1A:
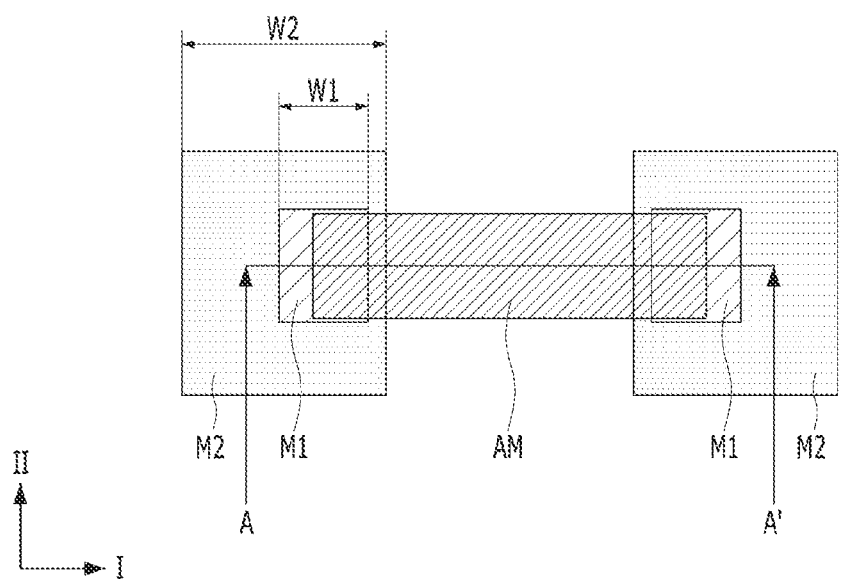
FIGS. 1A, 1B, and 1C are diagrams illustrating the structure of a semiconductor device in accordance with an embodiment.
Figure 1B:
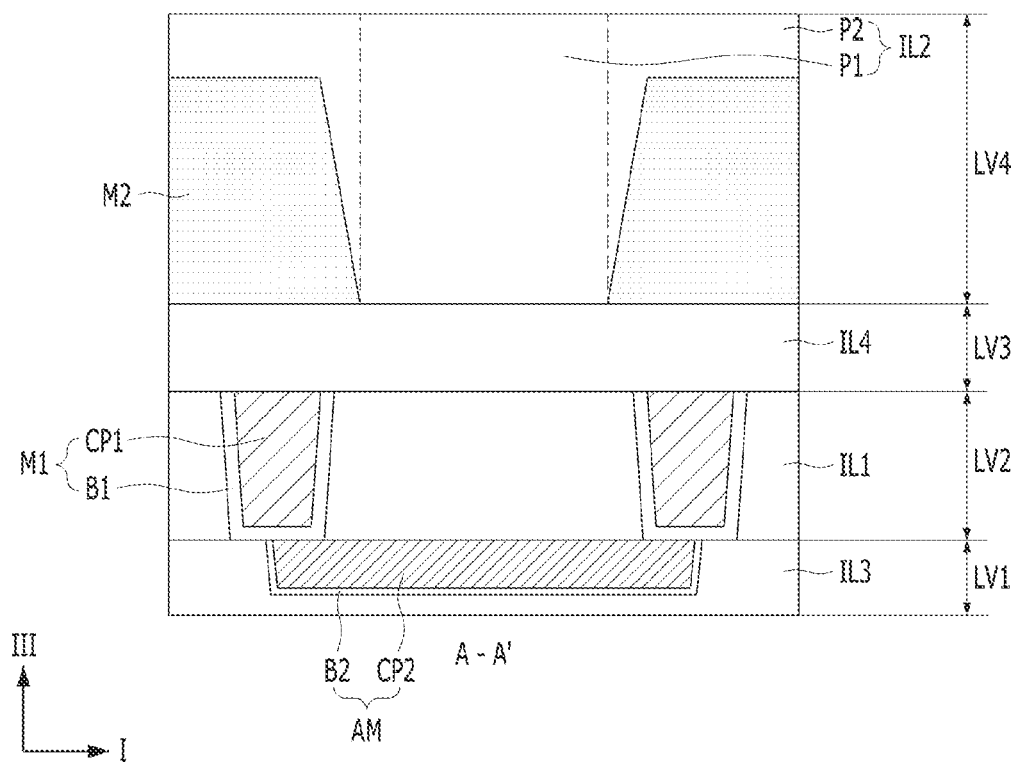
Figure 1C:
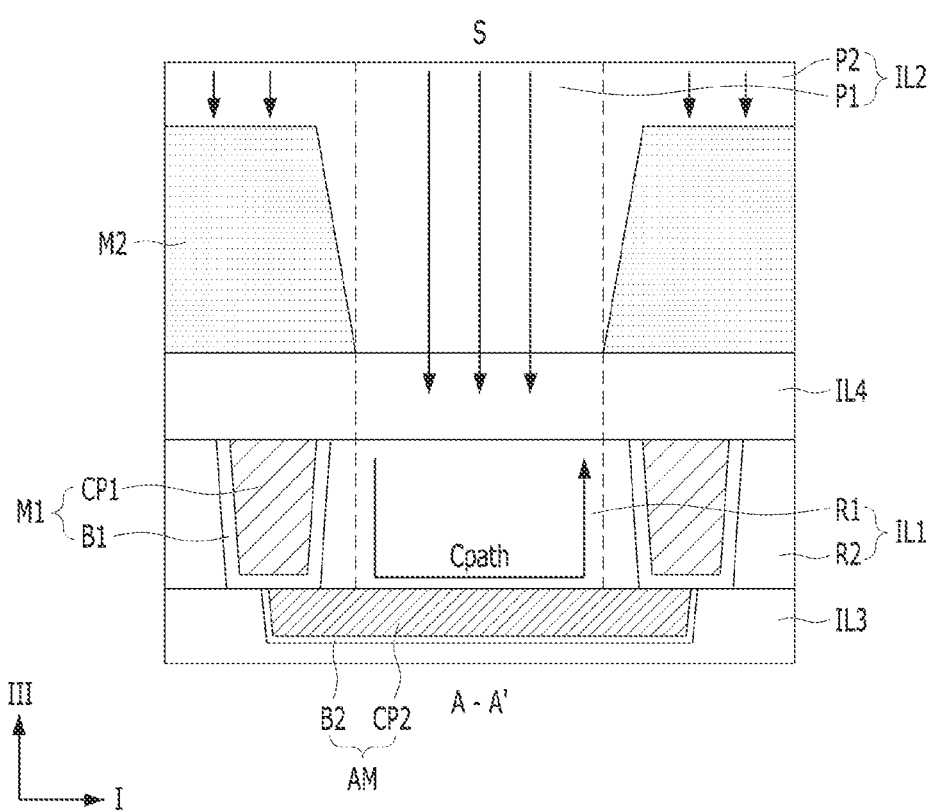

FIGS. 1A to 1C are diagrams illustrating the structure of a semiconductor device in accordance with an embodiment. FIG. 1A may be a plane view, and FIG. 1B may be a cross-sectional view taken along line A-A' of FIG. 1A.

Referring to FIGS. 1A and 1B, the semiconductor device may include first wiring lines M1, second wiring lines M2, a second interlayer insulating layer IL2, and an auxiliary wiring line AM. The semiconductor device may further include a first interlayer insulating layer IL1, a third interlayer insulating layer IL3, or a fourth interlayer insulating layer IL4, or further include one or more combinations thereof.

The first wiring lines M1 may be spaced apart from each other in a first direction I. The first wiring lines M1 may be arranged in the first direction I and a second direction II crossing the first direction I. Alternatively, the first wiring lines M1 may be extended in the second direction II.

The first wiring lines M1 may include a first metal. In an embodiment, the first metal may include copper (Cu). Each of the first wiring lines M1 may include a first barrier layer B1 and a first conductive layer CP1. The first barrier layer B1 may cover at least a part of the outer surface of the first conductive layer CP1. In an embodiment, the first barrier layer B1 may prevent or mitigate the material of the first conductive layer CP1 from diffusing. In an embodiment, the first barrier layer B1 may include a metal such as titanium (Ti) or tantalum (Ta), and the first conductive layer CP1 may include a metal such as copper (Cu).

The first wiring lines M1 may be formed in the first interlayer insulating layer IL1. The gap between the first wiring lines M1 neighboring each other in the first direction I may be filled with the first interlayer insulating layer IL1. The top surfaces of the first wiring lines M1 may be located on substantially the same plane as the top surface of the first interlayer insulating layer IL1. The bottom surfaces of the first wiring lines M1 may be located on substantially the same plane as the bottom surface of the first interlayer insulating layer IL1. Here, "substantially" indicates that measurement values not only are equal to each other, but also are included in a range including a process error. The first interlayer insulating layer IL1 may include an insulating material such as oxide, nitride or air gap.

In an embodiment, the first interlayer insulating layer IL1 may include silicon oxide ($SiO_2$). When the first interlayer insulating layer IL1 includes silicon oxide ($SiO_2$) and the first conductive layer CP1 includes copper (Cu), the Cu may diffuse into the first interlayer insulating layer IL1. Therefore, the first barrier layer B1 may include a material deposited as a fine structure which is thermodynamically stable and dense. In an embodiment, the first barrier layer B1 may include a tantalum layer which has a better anti-diffusion function than a titanium nitride layer.

The second wiring lines M2 may be spaced apart from each other in the first direction I. The second wiring lines M2 may be arranged in the first direction I and the second direction II. Alternatively, the second wiring lines M2 may be extended in the second direction II.

The second wiring lines M2 may overlap the first wiring lines M1, respectively, in a third direction III. The third direction III may be a direction that protrudes from a plane defined by the first and second directions I and II. In an embodiment, the third direction III may indicate a stacking direction. Each of the second wiring lines M2 may overlap one or more first wiring lines M1. The second wiring lines M2 may be located over or under the first wiring lines M1, respectively. In an embodiment, a first wiring line M1 that corresponds to second wiring line M2 means that the first wiring line M1 overlaps with the second wiring line M2 in the stacking direction.

In a plane view, the first wiring lines M1 may each have a first width W1 in the first direction I, and the second wiring lines M2 may each have a second width W2 in the first direction I. The second width W2 may be equal to or larger than the first width W1. When the first or second wiring line M1 or M2 has a tapered cross-section, the first width W1 may be the maximum width of the first wiring line M1, and the second width W2 may be the maximum width of the second wiring line M2. In an embodiment, a first width W1 of a first wiring line M1 corresponding to a second wiring line M2 may have a smaller width that a second width W2 of the overlapping second wiring line M2.

The second wiring lines M2 may include a second metal. The second metal may be equal to or different from the first metal. In an embodiment, the second metal may include aluminum (Al).

The second wiring lines M2 may be formed in the second interlayer insulating layer IL2. The gap between the second wiring lines M2 neighboring each other in the first direction I may be filled with the second interlayer insulating layer IL2. The second interlayer insulating layer IL2 may include a first portion P1 and a second portion P2. The first portion P1 may fill the gap between the second wiring lines M2. The second portion P2 may be connected to the first portion P1, and located at the tops of the second wiring lines M2. In an embodiment, the first portion P1 is located in a gap between neighboring second wiring lines M2 in the first direction I.

The top surfaces of the second wiring lines M2 may be located at substantially the same level as or a different level from the top surface of the second interlayer insulating layer IL2. In an embodiment, the top surface of the second interlayer insulating layer IL2 may be located at a higher level than the top surfaces of the second wiring lines M2. The bottom surfaces of the second wiring lines M2 may be located at substantially the same plane as the bottom surface of the second interlayer insulating layer IL2. The second interlayer insulating layer IL2 may include an insulating material such as oxide, nitride or air gap. In an embodiment, the second interlayer insulating layer IL2 may include an oxide layer formed by using HDP (High Density Plasma).

The auxiliary wiring line AM may electrically couple the first wiring lines M1. The auxiliary wiring line AM may be extended in the first direction I, and electrically couple the first wiring lines M1 neighboring each other in the first direction I. The auxiliary wiring line AM may be located on the opposite side of the second wiring lines M2 with the first wiring lines M1 interposed therebetween. In an embodiment, the auxiliary wiring line AM may be located under the first wiring lines M1, and the second wiring lines M2 may be located over the first wiring lines M1. The auxiliary wiring line AM may abut on the bottom surfaces of the first wiring lines M1.

The auxiliary wiring line AM may overlap the first portion P1 of the second interlayer insulating layer IL2 in the stacking direction. On the other hand, the first wiring lines M1 might not overlap the first portion P1 of the second interlayer insulating layer IL2 in the stacking direction. The first wiring lines M1 may overlap the second portion P2 of the second interlayer insulating layer IL2 in the stacking direction, but the second wiring lines M2 may be located between the second portion P2 and the first wiring lines M1.

The auxiliary wiring line AM may include a third metal. The third metal may be the same as or different from the first or second metal. The third metal may have a smaller diffusion coefficient than the first metal. In an embodiment, the first metal may include copper (Cu), and the third metal may include tungsten (W). The auxiliary wiring line AM may include a second barrier layer B2 and a second conductive layer CP2. The second barrier layer B2 may cover at least a part of the outer surface of the second conductive layer CP2. In an embodiment, the second barrier layer B2 may include a material having thermal stability, and have a melting point of 3,220° C. or less. The second barrier layer B2 may include a material having low specific resistance, and have a specific resistance of 20 μΩ or less. In an embodiment, the second barrier layer B2 may prevent or mitigate the diffusion of material between peripheral layers. In an embodiment, the second barrier layer B2 may include metal nitride such as titanium nitride (TiN). The second conductive layer CP2 may include tungsten (W).

The auxiliary wiring line AM may be formed in the third interlayer insulating layer IL3. The top surface of the auxiliary wiring line AM may be located on substantially the same plane as the top surface of the third interlayer insulating layer IL3. The bottom surface of the auxiliary wiring line AM may be located at substantially the same level as or a different level from the bottom surface of the third interlayer insulating layer IL3. The bottom surface of the auxiliary wiring line AM may be located at a higher level than the bottom surface of the third interlayer insulating layer IL3. The third interlayer insulating layer IL3 may include an insulating material such as oxide, nitride or air gap. In an embodiment, the third interlayer insulating layer IL3 may include silicon nitride ($Si_3N_4$).

The fourth interlayer insulating layer IL4 may be located between the first and second interlayer insulating layers IL1 and IL2. The fourth interlayer insulating layer IL4 may include an insulating material such as oxide, nitride or air gap. In an embodiment, the fourth interlayer insulating layer IL4 may include silicon nitride (SiN), silicon carbon nitride (SiCN) or TEOS ($Si(OC_2H_5)_4$), or include one or more combinations thereof.

The fourth interlayer insulating layer IL4 may insulate the first wiring lines M1 and the second wiring lines M2 from each other. Alternatively, one or more contact plugs (not illustrated) may be located in the fourth interlayer insulating layer IL4. The contact plugs may electrically couple the first wiring lines M1 to the second wiring lines M2.

The first wiring lines M1, the second wiring lines M2, and the auxiliary wiring line AM may be located at different levels. The auxiliary wiring line AM and the third interlayer insulating layer IL3 may be located at a first level LV1, the first wiring lines M1 and the first interlayer insulating layer IL1 may be located at a second level LV2, the fourth interlayer insulating layer IL4 may be located at a third level LV3, and the second wiring lines M2 and the second interlayer insulating layer IL2 may be located at a fourth level LV4. The first to fourth levels LV1 to LV4 may be arranged in the stacking direction. In some embodiments, the first level LV1 may be set to the lowermost level, and the fourth level LV4 may be set to the uppermost level. Here, 'upper' and 'lower' may be a relative concept. For example, in other embodiments, the fourth level LV4 may be set to the lowermost level, and the first level LV1 may be set to the uppermost level.

As the first to fourth interlayer insulating layers IL1 to IL4 are stacked, tensile stress or compressive stress may occur between the layers. In particular, the second interlayer insulating layer IL2 may apply stress in the stacking direction, and degrade the wiring lines or the interface between the layers located thereunder. Therefore, in accordance with the present embodiment, the first wiring lines M1, the second wiring lines M2, and the auxiliary wiring line AM are arranged to minimize stress between the layers.

Referring to FIG. 1C, the first interlayer insulating layer IL1 includes a stress shielding region R2 and a stress exposure region R1. The stress shielding region R2 and the stress exposure region R1 may be decided in consideration of the stress caused by the second interlayer insulating layer IL2, or defined according to the position of the second wiring line M2.

In the stress shielding region R2, the stress caused by the second interlayer insulating layer IL2 may be shielded and minimized by the second wiring lines M2. In an embodiment, the stress shielding region R2 may be a region of the first interlayer insulating layer IL1, which overlaps the second wiring line M2 in the stacking direction.

The stress exposure region R1 may receive higher stress than the stress shielding region R2. The stress exposure region R1 may be exposed to stress caused by the second interlayer insulating layer IL2, and might not overlap the second wiring line M2 in the stacking direction.

The stress shielding region R2 may be located to correspond to the second portion P2 of the second interlayer insulating layer IL2, and the stress exposure region R1 may be located to correspond to the first portion P1 of the second interlayer insulating layer IL2.

The first wiring lines M1 may be located in the stress shielding region R2. In an embodiment, the first wiring lines M1 may be located under the second wiring lines M2, respectively, and the second wiring lines M2 may protect the first wiring lines M1 from stress S applied in the stacking direction by the second interlayer insulating layer IL2. Furthermore, in an embodiment, the second wiring lines M2 may have substantially the same width as or a larger width than the first wiring lines M1, and thus may shield or mitigate the stress applied to the first wiring lines M1.

In an embodiment, when the first wiring lines M1 are located in the stress exposure region R1, the stress S may reduce the adhesion at the interface between the first wiring lines M1 and the fourth interlayer insulating layer IL4. In this case, an air gap may be formed at the interface. Through the air gap, metal ions within the first wiring lines M1 may diffuse or migrate into the fourth interlayer insulating layer IL4.

In accordance with the present embodiment, the first wiring lines M1. are not located in the stress exposure region R1. Since the first wiring lines M1 located in the stress shielding region R2 are protected by the second wiring lines M2, it may be possible in an embodiment to minimize or prevent the exposure of the interface between the first wiring lines M1 and the fourth interlayer insulating layer IL4 to the stress S. Furthermore, in an embodiment, it is possible to minimize or prevent the reduction in adhesion or the formation of the air gap at the interface.

The auxiliary wiring line AM is located in the third interlayer insulating layer IL3, and not located in the stress exposure region R1. Therefore, in an embodiment, it is possible to minimize or prevent the transfer of the stress S, caused by the second interlayer insulating layer IL2, to the auxiliary wiring line AM. Although the stress S is transferred, in an embodiment, it is possible to minimize the diffusion or migration of the material of the auxiliary wiring line AM into the peripheral layers, because the auxiliary wiring line AM is formed of a material having a smaller diffusion coefficient than the first wiring lines M1.

Furthermore, although the first wiring lines M1 located in the stress shielding region R2 are physically isolated from each other, the first wiring lines M1 may be electrically coupled by the auxiliary wiring line AM. Through the auxiliary wiring line AM, a current path Cpath between the first wiring lines M1 may be provided.

In the above-described structure, the first wiring lines M1 are not located in the stress exposure region R1 of the first interlayer insulating layer IL1. Therefore, in an embodiment, it is possible to minimize or prevent damage to the first wiring lines M1 or the interfaces between the first wiring lines M1 and the fourth interlayer insulating layer IL4 by the stress S caused by the second interlayer insulating layer IL2. Furthermore, the first wiring lines M1 may be electrically coupled by the auxiliary wiring line AM.

Figure 2A:
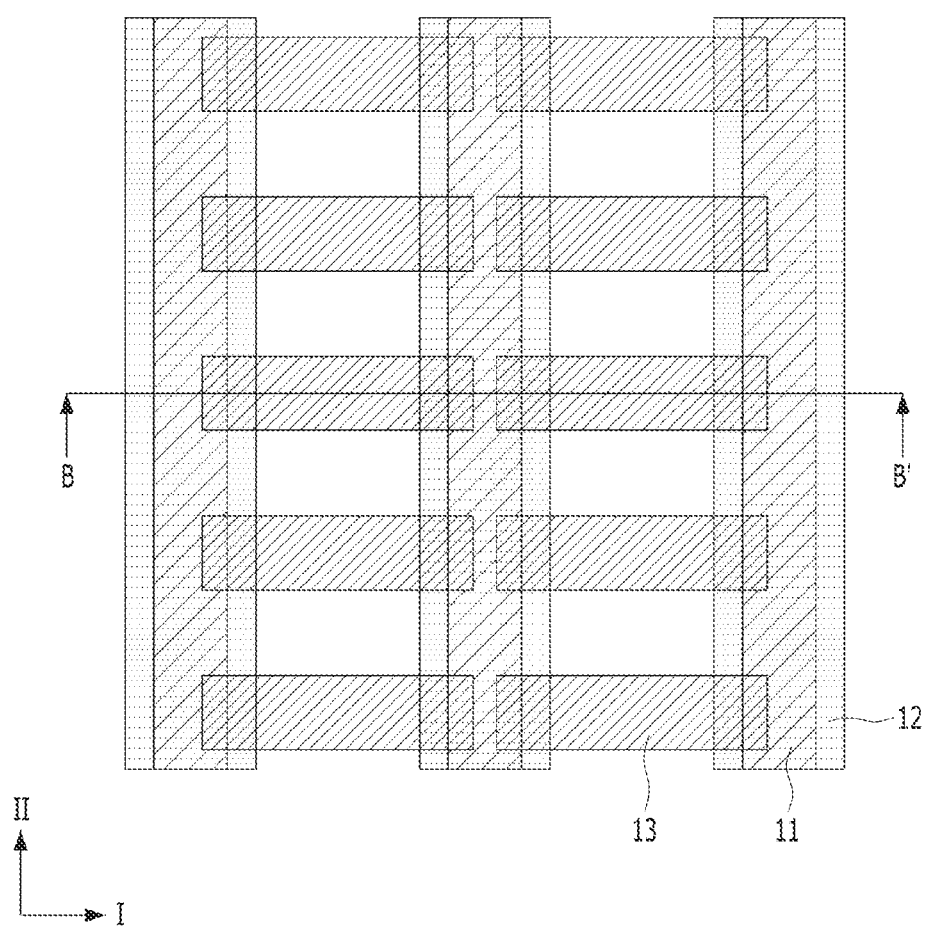
FIGS. 2A and 2B are diagrams illustrating the structure of a semiconductor device in accordance with an embodiment.
Figure 2B:
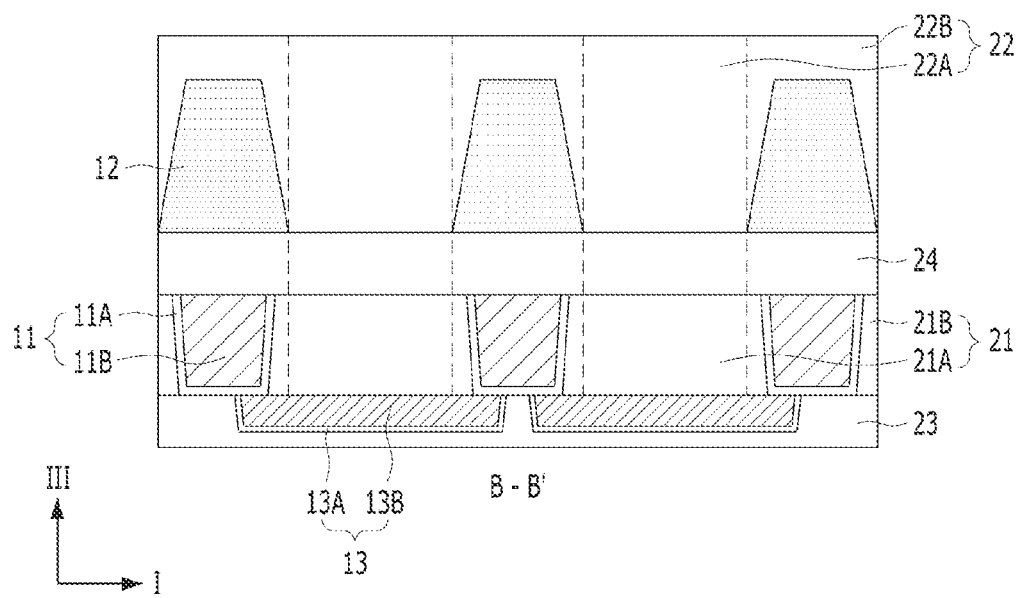

FIGS. 2A and 2B are diagrams illustrating the structure of a semiconductor device in accordance with an embodiment. FIG. 2A may be a plane view, and FIG. 2B may be a cross-sectional view taken along line B-B' of FIG. 2A. In the following descriptions, the overlapping contents of the above-described embodiment will be omitted Referring to FIGS. 2A and 2B, the semiconductor device may include first wiring lines 11, second wiring lines 12, a second interlayer insulating layer 22, and auxiliary wiring lines 13. The semiconductor device may further include a first interlayer insulating layer 21, a third interlayer insulating layer 23, or a fourth interlayer insulating layer 24, or further include one or more combinations thereof.

The first wiring lines 11 may be spaced apart from each other in a first direction I. The first wiring lines 11 may be extended in a second direction II crossing the first direction I. Each of the first wiring lines 11 may include a first barrier layer 11A and a first conductive layer 11B. In an embodiment, the first barrier layer 11A may include a metal such as tantalum (Ta), and the first conductive layer 11B may include a metal such as copper (Cu).

The first wiring lines 11 may be formed in the first interlayer insulating layer 21. The first interlayer insulating layer 21 may include a stress exposure region 21A and a stress shielding region 21B. The first wiring lines 11 may be located in the stress shielding region 21B.

The second wiring lines 12 may be spaced apart from each other in the first direction I. The second wiring lines 12 may be extended in the second direction II. The second wiring lines 12 may overlap the respective first wiring lines 11 in a third direction III, e.g. a stacking direction.

The second wiring lines 12 may be formed in the second interlayer insulating layer 22. The second interlayer insulating layer 22 may include a first portion 22A and a second portion 22B. The first portion 22A may fill the gap between the second wiring lines 12. The second portion 22B may be connected to the first portion 22A, and located at the tops of the second wiring lines 12. In an embodiment, the second wiring lines 12 may shield stress applied to the first wiring lines 11 from the second portion 22B.

The auxiliary wiring lines 13 may electrically couple the first wiring lines 11. The auxiliary wiring lines 13 may be arranged in the first direction I and the second direction II, and extended in the first direction I. The auxiliary wiring lines 13 may be located under the first wiring lines 11, and the second wiring lines 12 may be located over the first wiring lines 11. The auxiliary wiring lines 13 may be located in the third interlayer insulating layer 23, and located under the stress exposure region 21A.

The auxiliary wiring lines 13 may each include a second barrier layer 13A and a second conductive layer 13B. The second conductive layer 13B may include a material having a smaller diffusion coefficient than the first conductive layer 11B. The first conductive layer 11B may include a metal such as copper (Cu), and the second conductive layer 13B may include a metal such as tungsten.

The fourth interlayer insulating layer 24 may be located between the first and second interlayer insulating layers 21 and 22. In an embodiment, the third interlayer insulating layer 23, the first interlayer insulating layer 21, the fourth interlayer insulating layer 24, and the second interlayer insulating layer 22 may be sequentially stacked in the stacking direction.

In an embodiment, the above-described structure can minimize or prevent damage to the first wiring lines 11 or the interfaces between the first wiring lines 11 and the fourth interlayer insulating layer 24 by stress caused by the second interlayer insulating layer 22. Furthermore, the auxiliary wiring lines 13 may electrically couple the first wiring lines 11.

Figure 3A:
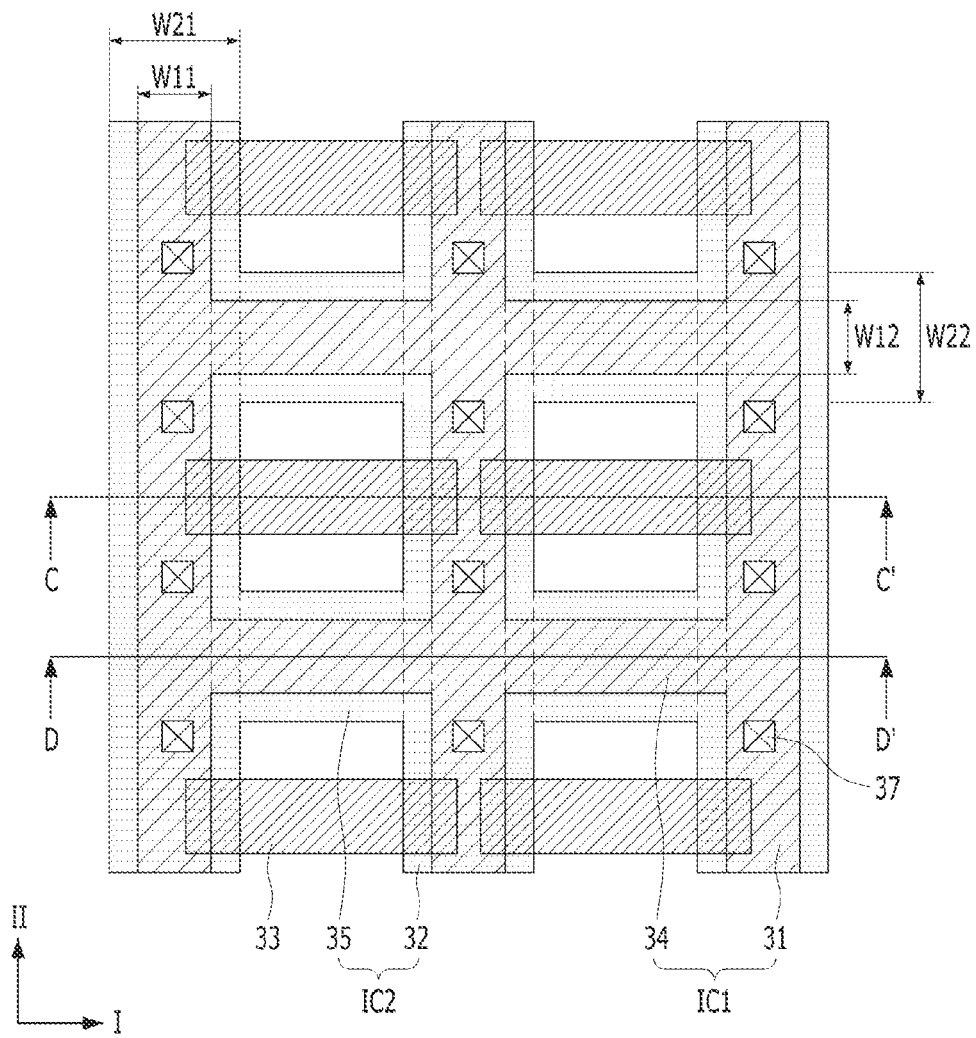
FIGS. 3A, 3B, and 3C are diagrams for describing the structure of a semiconductor device in accordance with an embodiment.
Figure 3B:
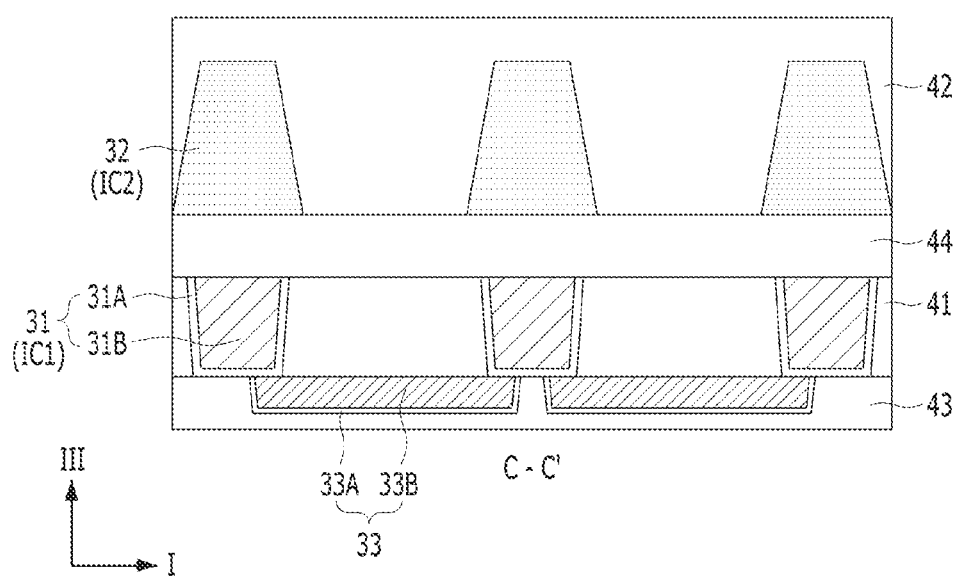
Figure 3C:
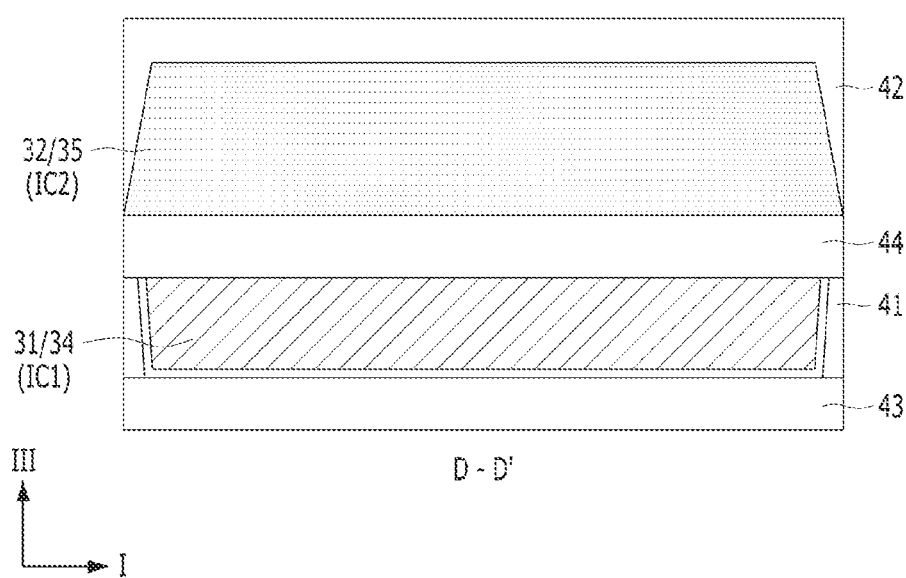

FIGS. 3A to 3C are diagrams for describing the structure of a semiconductor device in accordance with an embodiment. FIG. 3A may be a plane view, FIG. 3B may be a cross-sectional view taken along line C-C' of FIG. 3A, and FIG. 3C may be a cross-sectional view taken along line D-D' of FIG. 3A. In the following descriptions, the overlapping contents of the above-described embodiment will be omitted.

Referring to FIGS. 3A to 3C, the semiconductor device may include a first interconnection IC1, a second interconnection IC2, a second interlayer insulating layer 42, and first auxiliary wiring lines 33. The semiconductor device may further include a first interlayer insulating layer 41, a third interlayer insulating layer 43, a fourth interlayer insulating layer 44, second auxiliary wiring lines 34, third auxiliary wiring lines 35, or contact plugs 37, or further include one or more combinations thereof.

The first interconnection IC1 may include first wiring lines 31 and the second auxiliary wiring lines 34. The first wiring lines 31 may be spaced apart from each other in a first direction I, and extended in a second direction II. The second auxiliary wiring lines 34 may be located between the first wiring lines 31. The second auxiliary wiring lines 34 may be connected to sidewalls of the first wiring lines 31. The second auxiliary wiring lines 34 may be extended in the first direction I, and electrically couple the first wiring lines 31 neighboring each other in the first direction I.

Each of the first wiring lines 31 may include a first barrier layer 31A and a first conductive layer 31B, Each of the second auxiliary wiring lines 34 may include a second barrier layer and a second conductive layer in the second barrier layer. The first wiring lines 31 and the second auxiliary wiring lines 34 may be connected as one layer. Alternatively, the first wiring lines 31 and the second auxiliary wiring lines 34 may be layers formed through separate processes, and interfaces may be present between the first wiring lines 31 and the second auxiliary wiring lines 34. FIG. 3C illustrates that the first wiring lines 31 and the second auxiliary wiring lines 34 are formed together. In this case, the first barrier layer 31A and the second barrier layer may be formed as a single layer, and the first conductive layer 31B and the second conductive layer may be formed as a single layer.

The second interconnection IC2 may include second wiring lines 32 and the third auxiliary wiring lines 35. The second interconnection IC2 may be located in the second interlayer insulating layer 42. The second wiring lines 32 may be spaced apart from each other in the first direction I, and extended in the second direction II. The third auxiliary wiring lines 35 may be located between the second wiring lines 32. The third auxiliary wiring lines 35 may be extended in the first direction I, and electrically couple the second wiring lines 32 neighboring each other in the first direction I.

The first interconnection IC1 may be located in the first interlayer insulating layer 41. The second interconnection IC2 may be located in the second interlayer insulating layer 42. The first interlayer insulating layer 41 may include a stress shielding region and a stress exposure region. The stress shielding region may overlap the second interconnection IC2 in a third direction III, for example, a stacking direction. The stress exposure region might not overlap the second interconnection IC2 in the stacking direction. The first interconnection IC1 may be located in the stress shielding region of the first interlayer insulating layer 41.

The first auxiliary wiring lines 33 may be located under the first wiring lines 31. The first auxiliary wiring lines 33 may be connected to the bottom surfaces of the first wiring lines 31. The first auxiliary wiring lines 33 may be located in the third interlayer insulating layer 43. Each of the first auxiliary wiring lines 33 may include a third barrier layer 33A and a third conductive layer 33B.

In a plane view, the first auxiliary wiring lines 33 and the second auxiliary wiring lines 34 may be spaced apart from each other in the second direction II. The first auxiliary wiring lines 33 and the second auxiliary wiring lines 34 may be alternately arranged in the second direction II. In a plane view, the first auxiliary wiring lines 33 and the third auxiliary wiring lines 35 may be spaced apart from each other in the second direction II. The first auxiliary wiring lines 33 and the third auxiliary wiring lines 35 may be alternately arranged in the second direction II. The first auxiliary wiring lines 33 might not overlap the second interconnection IC2 in the stacking direction, The first wiring lines 31 and the second wiring lines 32 may overlap each other in the stacking direction. In a plane view, the first wiring lines 31 may each have a first width W11 in the first direction I, and the second wiring lines 32 may each have a second width W21 in the first direction I. The second width W21 may be equal to or larger than the first width W11. Therefore, in an embodiment, stress applied to the first wiring lines 31 from the second interlayer insulating layer 42 may be shielded by the second wiring lines 32.

The second auxiliary wiring lines 34 and the third auxiliary wiring lines 35 may overlap each other in the stacking direction. In a plane view, the second auxiliary wiring lines 34 may each have a first width W12 in the second direction II, and the third auxiliary wiring lines 35 may each have a second width W22 in the second direction II. The second width W22 may be equal to or larger than the first width W12. Therefore, in an embodiment, stress applied to the second auxiliary wiring lines 34 from the second interlayer insulating layer 42 may be shielded by the third auxiliary wiring lines 35.

The contact plugs 37 may be located between the first and second interconnections IC1 and IC2. The contact plugs 37 may electrically couple the first and second interconnections IC1 and IC2. In an embodiment, the contact plugs 37 may electrically couple the first wiring lines 31 and the second wiring lines 32. The contact plugs 37 may be located in the fourth interlayer insulating layer 44. The contact plugs 37 may be arranged in the first direction I and the second direction II.

The above-described structure, in an embodiment, can minimize or prevent damage to the first interconnection IC1 or the interface between the first interconnection IC1 and the fourth interlayer insulating layer 44 by stress caused from the second interlayer insulating layer 42.

Figure 4A:
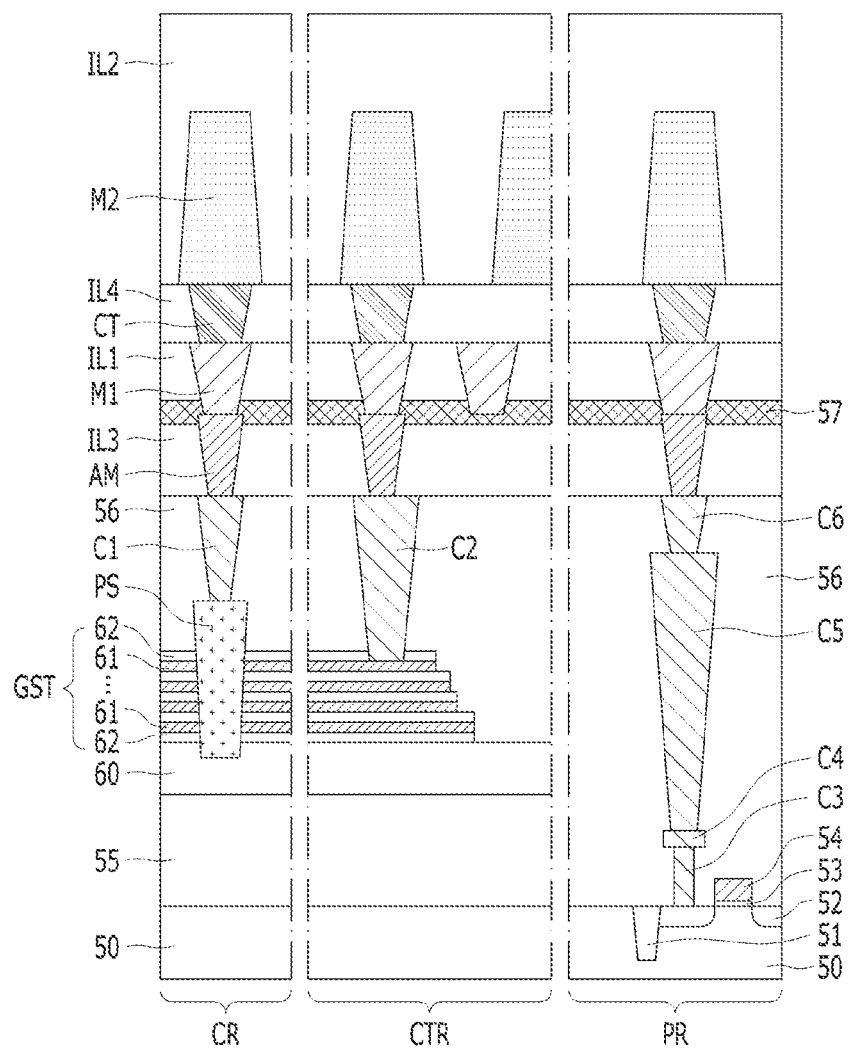
FIGS. 4A and 4B are diagrams illustrating the structure of a semiconductor device in accordance with an embodiment.
Figure 4B:
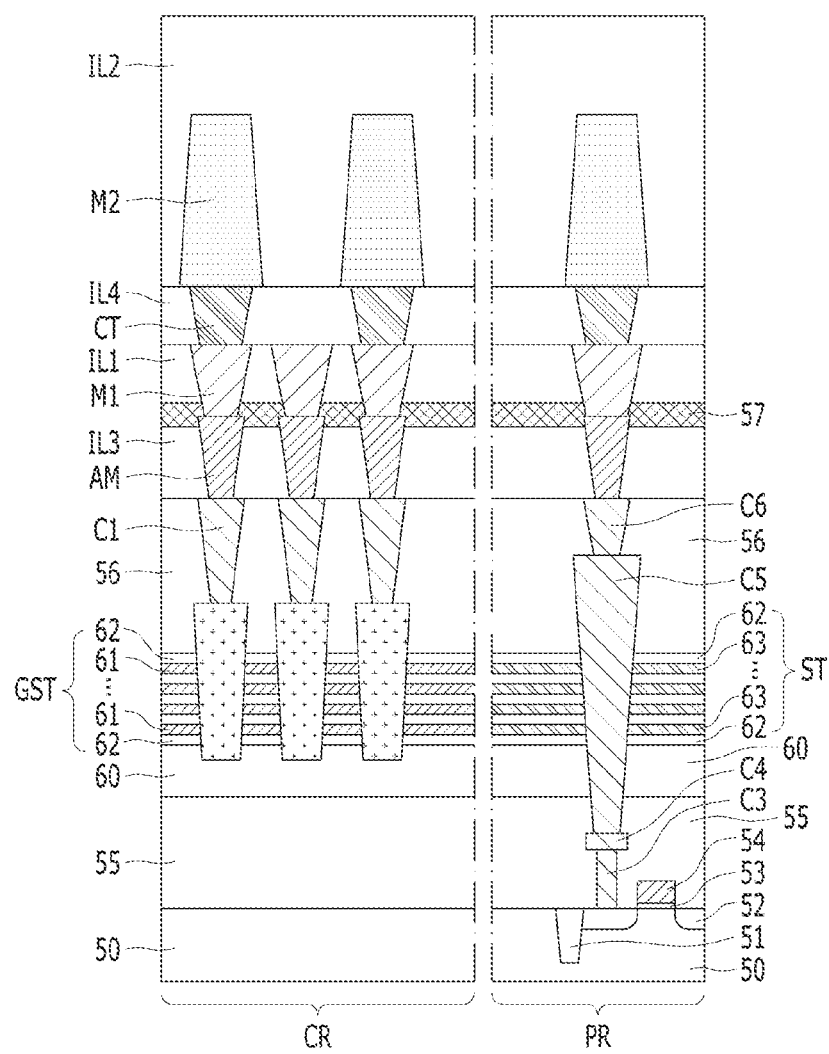

FIGS. 4A and 4B are diagrams illustrating the structure of a semiconductor device in accordance with an embodiment.

Referring to FIG. 4A, the semiconductor device may include a first base 50, and the first base 50 may include a cell region CR, a contact region CTR, and a peripheral region PR. The first base 50 may be a semiconductor substrate. A cell array may be located in the cell region CR of the first base 50. The cell array may include memory cells stacked in a third direction III. A peripheral circuit for driving the cell array may be located in the peripheral region PR of the first base 50. The peripheral circuit may include a transistor, a capacitor, a register and the like. Pads and interconnections for applying a bias may be located in the contact region CTR of the first base 50. The interconnections may include wiring lines, contact plugs and the like.

The semiconductor device may include a second base 60, a penetration structure PS, and a gate structure GST, which are located in the cell region CR. The second base 60 may include a semiconductor substrate, a source structure and the like. The source structure may have a single-layer or multi-layer structure. In an embodiment, the source structure may include a conductive material such as polysilicon or metal.

An interlayer insulating layer 55 may be located between the second base 60 and the first base 50. The interlayer insulating layer 55 may have a single-layer or multi-layer structure. Although not illustrated in the drawings, the peripheral circuit may be located in the interlayer insulating layer 55.

The gate structure GST may be located on the second base 60. The gate structure GST may include conductive layers 61 and insulating layers 62 which are alternately stacked. The conductive layers 61 may be word lines or select lines.

The penetration structure PS may penetrate the gate structure GST, and extend to the second base 60. Memory cells may be located at the respective intersections between the penetration structure PS and the conductive layers 61. Along the penetration structure PS, the memory cells may be stacked.

In an embodiment, the penetration structure PS may be a channel structure. The channel structure may include a channel layer penetrating the gate structure GST, and further include a memory layer covering the outer wall of the channel layer. The memory layer may include a tunneling layer, a data storage layer, or a blocking layer, or include one or more combinations thereof. The channel structure may be connected to the source structure, included in the second base 60, through the gate structure GST. The channel layer may be directly connected to the source structure, or connected to the source structure through a semiconductor pattern grown by an epitaxial method.

In an embodiment, the penetration structure PS may be an electrode structure. The electrode structure may include an electrode layer penetrating the gate structure GST, and further include a memory layer covering the outer wall or inner wall of the electrode layer. The memory layer may include a variable resistance material.

One or more first wiring lines M1 of first wiring lines M1 may be connected to the penetration structure PS through an auxiliary wiring line AM and a first contact structure C1. The first wiring line M1 connected to the penetration structure PS may be a bit line. Furthermore, the first wiring line M1 may be electrically coupled to a second wiring line M2 through the contact plug CT.

The semiconductor device may include the second base 60, the gate structure GST, and a second contact structure C2, which are located in the contact region CTR. In an embodiment, the second base 60 and the gate structure GST which are located in the cell region CR may be extended to the contact region CTR. The conductive layers 61 included in the gate structure GST may be exposed in the contact region CTR. In an embodiment, a portion of the gate structure GST, corresponding to the contact region CTR, may have a stair-shaped structure. Portions of the respective conductive layers 61, exposed through a stair-shaped structure, may serve as pads.

The second contact structures C2 may be electrically coupled to the conductive layers 61. The second contact structure C2 may be connected to the pads of the conductive layers 61 through an interlayer insulating layer 56. One or more first wiring lines M1 of the first wiring lines M1 may be electrically coupled to the conductive layer 61 through the auxiliary wiring line AM and the second contact structure C2. Furthermore, the first wiring line M1 may be electrically coupled to the second wiring line M2 through the contact plug CT.

The semiconductor device may include the peripheral circuit located in the peripheral region PR. An isolation layer 51 may be located in the first base 50, and define an active region. The transistor may be located in the active region of the first base 50. The transistor may include a gate insulating layer 53, a gate electrode 54, and a junction 52.

A fifth contact structure C5 may be electrically coupled to the peripheral circuit through the interlayer insulating layer 56. In an embodiment, the interlayer insulating layer 56 may have a single-layer or multi-layer structure. The interlayer insulating layer 56 may be a layer connected to the interlayer insulating layer 55 or a layer separated from the interlayer insulating layer 55.

One or more first wiring lines M1 of the first wiring lines M1 may be electrically coupled to the peripheral circuit through the auxiliary wiring line AM, a sixth contact structure C6, and the fifth contact structure C5. In an embodiment, the fifth contact structure C5 may be electrically coupled to the junction 52 through a fourth contact structure C4 and a third contact structure C3.

An etch-stop layer 57 may be located between a first interlayer insulating layer IL1 and a third interlayer insulating layer IL3. The etch-stop layer 57 may include a material having a high etch selectivity with respect to the first interlayer insulating layer IL1. In an embodiment, the first interlayer insulating layer IL1 may include oxide, and the etch-stop layer 57 may include nitride. The first wiring lines M1 or the auxiliary wiring lines AM may pass through the etch-stop layer 57.

The first to sixth contact structures C1 to C6 may be contact plugs or wiring lines. The top surface of the fifth contact structure C5 may be located at a higher level than the top surface of the penetration structure PS. The top surfaces of the first contact structure C1, the second contact structure C2, and the sixth contact structure C6 may be located at substantially the same level or different levels.

The sixth contact structure C6, the auxiliary wiring line AM, the first wiring line M1, and the contact plug CT may have substantially the same height or different heights. The sixth contact structure C6, the auxiliary wiring line AM, the first wiring line M1, and the contact plug CT may have substantially the same width or different widths. The top surfaces of the first to sixth contact structures C1 to C6, the auxiliary wiring line AM, the first wiring line M1, the contact plug CT, and the second wiring line M2 may have substantially the same width as or different widths from the bottom surfaces thereof. In an embodiment, each of the first to sixth contact structures C1 to C6, the auxiliary wiring line AM, the first wiring line M1, or the contact plug CT may have a tapered cross-section in which the bottom surface thereof has a smaller width than the top surface thereof. The second wiring line M2 may have a tapered cross-section in which the bottom surface thereof has a larger width than the top surface thereof.

Referring to FIG. 4B, the fifth contact structure C5 may pass through a stacked structure ST. In an embodiment, the fifth contact structure C5 may be electrically coupled to the peripheral circuit through the interlayer insulating layer 56, the stacked structure ST, and the second base 60. In an embodiment, the stacked structure ST may be a mold structure including sacrificial layers 63 and insulating layers 62 which are alternately stacked. The sacrificial layers 63 may be layers which are not substituted with conductive layers but left during a fabrication process. The insulating layers 62 of the stacked structure ST may be formed as the insulating layers 62 of the gate structure GST are extended. The peripheral circuit may be located under the stacked structure ST or the gate structure GST, In an embodiment, the cell array may be located over the peripheral circuit.

In an embodiment, the above-described structure may provide a bias transfer path by using the interconnection including the first wiring lines M1 and the auxiliary wiring lines AM. Therefore, in an embodiment, the interconnection may have a stable structure, which makes it possible to minimize or prevent degradation in operation speed and reliability by an interconnection defect.

For reference, although not illustrated in FIGS. 4A and 4B, a test pad may be located over the second wiring line M2. The test pad may be electrically coupled to the second wiring line M2. Through the test pad, in an embodiment, the yield and electrical characteristics of the semiconductor device may be tested.

Furthermore, FIGS. 4A and 4B illustrate that the cell region CR and the peripheral region PR are included in one chip. However, this is only an example for convenience of description, and the present embodiment is not limited thereto. The cell region CR and the peripheral region PR may be configured as separate chips. In an embodiment, a cell chip including the cell region CR and a peripheral circuit chip including the peripheral region PR may be fabricated through separate processes, and then bonded to each other.

The present embodiment may be applied to a semiconductor device including an interconnection. Examples of the semiconductor device may include not only a memory device, but also a device such as a display or sensor, which is implemented by semiconductor.

Although various embodiments have been described for illustrative purposes, be apparent to those skilled in the art that various changes and modifications may be made without departing from the spirit and scope of the disclosure as defined in the following claims.

What is claimed is:

1. A semiconductor device comprising:
a pair of first wiring lines spaced apart from each other in a first direction;
a plurality of second wiring lines located over the pair of first wiring lines;
an interlayer insulating layer comprising a first portion and a second portion, wherein the first portion is located in a gap between second wiring lines that neighbor each other in the first direction and the second portion is located over the plurality of second wiring lines to insulate the plurality of second wiring lines from each other; and
a first auxiliary wiring line extending in the first direction and electrically coupling the pair of first wiring lines, wherein a first end of the first auxiliary wiring line contacts one of the pair of first wiring lines and a second end of the first auxiliary wiring line contacts the other one of the pair of first wiring lines,
wherein the first auxiliary wiring line overlaps the first portion of the interlayer insulating layer in a stacking direction, and the pair of first wiring lines do not overlap the first portion of the interlayer insulating layer in the stacking direction;
wherein heights of the second wiring lines are greater than heights of the first wiring lines; and
further comprising:
a gate structure including conductive layers and insulating layers that are alternately stacked; and
penetration structures extending through the gate structure,
wherein the pair of first wiring lines are electrically coupled to the penetration structures or the conductive layers through the auxiliary wiring line.

2. The semiconductor device of claim 1, wherein the plurality of second wiring lines overlap the pair of first wiring lines, respectively, in the stacking direction.

3. The semiconductor device of claim 1,
wherein the plurality of second wiring lines each have a larger width than the corresponding first wiring line to cover the corresponding first wiring line.

4. The semiconductor device of claim 1, wherein the pair of first wiring lines and the plurality of second wiring lines are extended in a second direction crossing the first direction, and the first auxiliary wiring line is extended in the first direction.

5. The semiconductor device of claim 1, wherein the first auxiliary wiring line is located under the pair of first wiring lines.

6. The semiconductor device of claim 1, wherein the interlayer insulating layer comprises an oxide layer formed by using HDP (High Density Plasma).

7. The semiconductor device of claim 1, further comprising a second auxiliary wiring line located between the pair of first wiring lines, and electrically coupling the pair of first wiring lines.

8. The semiconductor device of claim 7, wherein the first auxiliary wiring line and the second auxiliary wiring line are spaced apart from each other in a second direction crossing the first direction.

9. The semiconductor device of claim 7, further comprising a third auxiliary wiring line located between the plurality of second wiring lines, and electrically coupling the second wiring lines.

10. The semiconductor device of claim 9, wherein the pair of first wiring lines and the plurality of second wiring lines are extended in a second direction crossing the first direction, and the first auxiliary wiring line, the second auxiliary line, and the third auxiliary wiring line are extended in the first direction.

11. The semiconductor device of claim 9, wherein the second auxiliary wiring line overlaps the third auxiliary wiring line in the stacking direction.

12. The semiconductor device of claim 9, wherein the third auxiliary wiring line has a larger width than the second auxiliary wiring line.

13. The semiconductor device of claim 1, wherein the pair of first wiring lines and the plurality of second wiring lines are insulated from each other.

14. The semiconductor device of claim 1, further comprising contact plugs electrically coupling the pair of first wiring lines and the plurality of second wiring lines.

15. The semiconductor device of claim 1, wherein the pair of first wiring lines each comprise a first metal, and the first auxiliary wiring line comprises a second metal different from the first metal.

16. The semiconductor device of claim 15, wherein the second metal has a smaller diffusion coefficient than the first metal.

17. A semiconductor device comprising:
first wiring lines extending in a second direction;
second wiring lines disposed over the first wiring lines and extending in the second direction;
an interlayer insulating layer comprising a first portion and a second portion, wherein the first portion is located in a gap between the second wiring lines and the second portion is disposed over the second wiring lines to insulate the second wiring lines from each other; and
an auxiliary wiring line extending in a first direction crossing the second direction and electrically coupling the first wiring lines,
wherein the first auxiliary wiring line overlaps the first portion of the interlayer insulating layer in a stacking direction, and the second wiring lines are interposed between the first wiring lines and the second portion of the interlayer insulating layer;
wherein heights of the second wiring lines are greater than heights of the first wiring lines; and
further comprising:
a gate structure including conductive layers and insulating layers that are alternately stacked; and
penetration structures extending through the gate structure,
wherein the first wiring lines are electrically coupled to the penetration structures or the conductive layers through the auxiliary wiring line.

18. The semiconductor device of claim 17, wherein the second wiring lines each have a larger width than the corresponding first wiring line to cover the corresponding first wiring line.

19. The semiconductor device of claim 17, wherein a top of the auxiliary wiring line contacts a bottom of the first wiring lines.

* * * * *